US006909603B2

US 6,909,603 B2

(12) United States Patent
Wiley

(10) Patent No.: US 6,909,603 B2
(45) Date of Patent: Jun. 21, 2005

(54) VENTILATING SLIDE RAIL MOUNT

(75) Inventor: Robert Wiley, Topsfield, MA (US)

(73) Assignee: Network Engines, Inc., Canton, MA (US)

( * ) Notice: Subject to any disclaimer, the term of this patent is extended or adjusted under 35 U.S.C. 154(b) by 0 days.

(21) Appl. No.: 10/602,454

(22) Filed: Jun. 23, 2003

(65) Prior Publication Data

US 2004/0072534 A1 Apr. 15, 2004

Related U.S. Application Data

(63) Continuation of application No. 09/899,512, filed on Jul. 5, 2001, now Pat. No. 6,590,768.
(60) Provisional application No. 60/215,997, filed on Jul. 5, 2000, and provisional application No. 60/244,354, filed on Oct. 30, 2000.

(51) Int. Cl.[7] ............................................... H05K 7/20
(52) U.S. Cl. ..................................................... 361/690
(58) Field of Search .............. 211/26; 312/265.1–265.6; 361/687–695, 725–727, 752, 831

(56) References Cited

U.S. PATENT DOCUMENTS 5,216,578 A    6/1993  Zenitani et al.
5,493,474 A    2/1996  Schkrohowsky et al.
5,626,406 A    5/1997  Schmid
6,297,962 B1   10/2001 Johnson et al.
6,339,532 B1   1/2002  Boulay
6,360,900 B1   3/2002  Carbonneau et al.
6,590,768 B1 * 7/2003  Wiley ......................... 361/690

* cited by examiner

Primary Examiner—Gregory Thompson
(74) Attorney, Agent, or Firm—David J. Powsner; Nutter McClennen & Fish

(57) ABSTRACT

The present invention is directed to a chassis slide assembly comprised of a mating rail and track that telescopically engage with one another and that are adapted for coupling to a chassis and to a rack to allow the chassis to be pulled out from the rack for inspection, service or repair. The rail and track each have at least one air flow aperture positioned to allow unobstructed venting of air through the slide assembly and through the side wall of the chassis. In one embodiment, the rail and track have a plurality of airflow apertures. The apertures of the rail and track can consist of a large-area openings, or of a plurality of slots or perforations. In one embodiment, the apertures of the rail are substantially aligned with the apertures of the track, e.g. when the rail and track are fully engaged with one another. An advantage of the present invention is that the additional air flow apertures in the chassis slide provide improved air flow through out the chassis, thereby reducing the possibility of overheating and component failure.

2 Claims, 6 Drawing Sheets

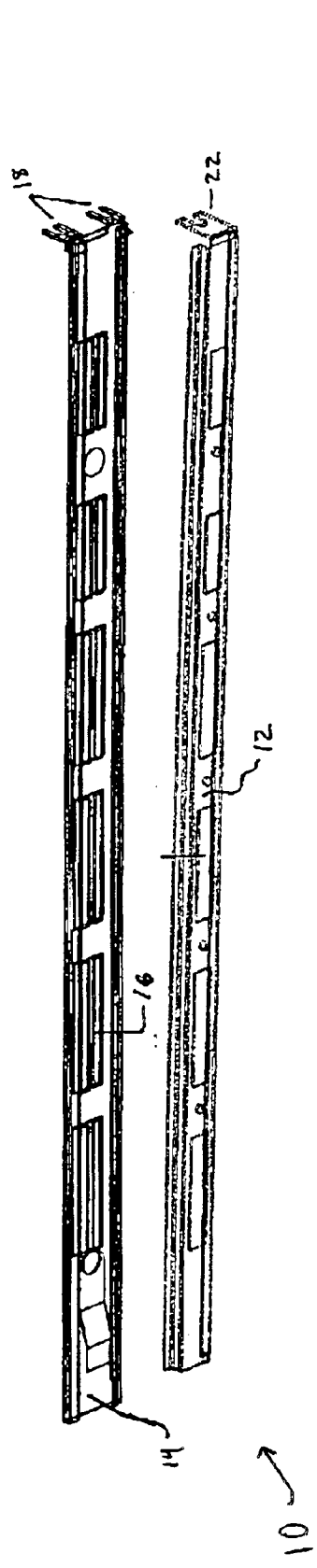
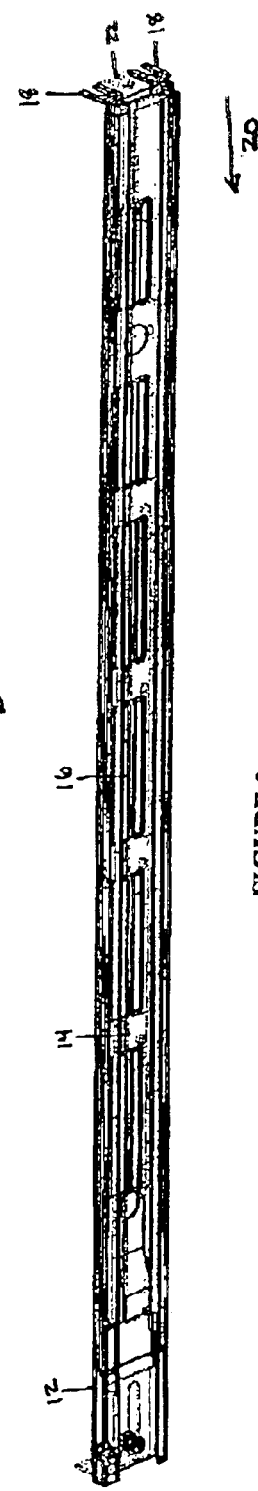
FIGURE 2
FIGURE 3

VENTILATING SLIDE RAIL MOUNT

CROSS-REFERENCE TO RELATED APPLICATIONS

This application is a continuation of U.S. Ser. No. 09/899,512, entitled "Ventilating Slide Rail Mount," filed on Jul. 5, 2001, now U.S. Pat. No. 6,540,768, which claims priority from earlier filed U.S. provisional patent application Ser. No. 60/215,997, filed Jul. 5, 2000, and U.S. provisional patent application Ser. No. 60/244,354, filed Oct. 30, 2000, both of which are incorporated herein by reference.

This application is related to the following co-pending, commonly assigned applications, the teachings of all of which are incorporated herein by reference: U.S. Ser. No. 60/215,952, filed Jul. 5, 2000, entitled "Server Architecture and Methods for Digital Data Processing," U.S. Ser. No. 60/216,055, filed Jul. 5, 2000, entitled "Low Profile Equipment Housing with Angular Fan," U.S. Ser. No. 60/215,975, filed Jul. 5, 2000, entitled "Low Profile, High Density Storage Array," U.S. Ser. No. 60/215,996,filed Jul. 5, 2000, entitled "Power Supply for Low Profile Equipment Housing," U.S. Ser. No. 60/215,995, filed Jul. 5, 2000, entitled "Circuit Board Riser," and U.S. Ser. No. 60/244,361, filed Oct. 30, 2000, entitled "Low Profile, High Density Storage Array."

BACKGROUND OF THE INVENTION

The present invention relates to digital data processors, and, in particular, to methods and apparatus for controlling the temperature of digital data processing devices. The invention has particular application in compact, "low profile" devices where space is at a premium and where overheating is of concern.

Heating is a constant and significant problem in digital data processors. The failure rates of many electronic components increase as operating temperatures rise. This is particularly true of central processing units which, themselves, often generate significant heat. The problem is compounded by the use of more densely packed circuit boards and by more compact, lower profile devices.

Most often, processors and associated components are cooled by airflow. Fans are typically used to push or pull air from one side of a chassis, across the enclosed components, and out the other side of the chassis. Thus, for example, a typical digital data storage device may include one or more chassis intake and/or exhaust fans, and possibly one or more additional fans on a power supply, central processing unit, or other heat sensitive parts. Processor chips or other specific parts may also be mounted on heat sinks that are cooled by the airflow, thus further augmenting the effective area, hence rate, of heat transfer.

While such measures have proven adequate to date, there is a need to provide for effective cooling of even more powerful, more confined and/or more compact systems.

One object of the present invention is to provide an improved digital data processor apparatus and methods.

A more particular object is to provide such apparatus and methods as are particularly adapted to rack mounted devices, such as web servers, array devices and other data processing apparatus, that are compact of design yet not prone to overheating.

A still further object is to provide such apparatus and methods as can be implemented at low cost.

A still further object of the invention is to provide such apparatus and methods as can be adapted to pre-existing equipment, as well as designed for use in new equipment.

SUMMARY OF THE INVENTION

One or more of the aforementioned objects are met by the present invention which provides, in one aspect, a chassis slide assembly having a rail and track that are adapted for coupling to a chassis and to a cabinet or rack, and slideably engage with one another. That is, they telescope to allow the chassis to be moved fully into the cabinet or rack for normal operation, or be pulled out from the cabinet or rack and for accessing or maintenance of elements on the chassis. The rail and track have at least one vent aperture and, preferably, many apertures, for facilitating a passage of air into and/or through the chassis. According to further or related aspects of the invention, the apertures of the rail are substantially aligned with the apertures of the track, e.g. when the rail and track are fully engaged with one another, e.g., in the fully closed position, and these in turn may align with vent openings in the side wall of the chassis. The airflow apertures in the chassis, slide and rail provide improved airflow out of the chassis. For example, they can be arranged to cooperate with back pressure or head, e.g., effected by fans within the chassis, to enhance airflow throughout the chassis interior and thereby enhance heat dissipation and reduce the possibility of overheating or component failure.

In one embodiment, the chassis is a rack-mountable chassis having vent apertures disposed along a rear portion of its side walls to define a front-to back airflow gradient The chassis vent apertures align with corresponding openings in the sliding rail assembly positioned to be in registry when the chassis is fully inserted in its rack or cabinet. Additional openings may be provided in the slide assembly to assure the rail does not occlude flow when the chassis extends from the rack an a servicing or troubleshooting position.

Further aspects of the invention provide a chassis slide as described above in which the track is adapted for mounting to an equipment mounting rack and/or within an equipment cabinet, and wherein the track can include at least one mounting clip that is adapted to receive a screw or bolt to secure the track to the rack or cabinet.

Further aspects of the invention provide a chassis slide as described above in which the rail includes a retention clip that is adapted to be fixed to at least one of the rack and the track to prevent slidable movement of the rail with respect to the track.

The invention provides, in other aspects, a digital data processing apparatus with one or more modules slidably mounted to an equipment rack (or within an equipment cabinet) with a slide and rail as described above. According to these aspects of the invention, the slide assembly mounts on the side of the chassis, and the chassis includes apertures, also on the side of the chassis, that align to those of the slide and/or rail, and that facilitate airflow within the modules.

Still further aspects of the invention provide a chassis slide assembly of the type described above that is additionally adapted for use with telco frames and other equipment racks that include only a single pair of mounting rails, e.g., "left" and "right" vertical mounting rails (e.g., in contrast to frames that include four such rails: left-front, right-front, left-rear, right-rear).

These and other aspects of the invention are evident in the drawings and in the descriptions that follow.

BRIEF DESCRIPTION OF THE DRAWINGS

The invention will be more fully understood from the following detailed description taken in conjunction with the accompanying drawings, in which:

FIG. 2 depicts rail and track components of one embodiment of a chassis slide in accordance with the present invention.

FIG. 3 depicts the chassis slide components of FIG. 2 assembled together.

DETAILED DESCRIPTION OF THE DRAWINGS

Figure 1:
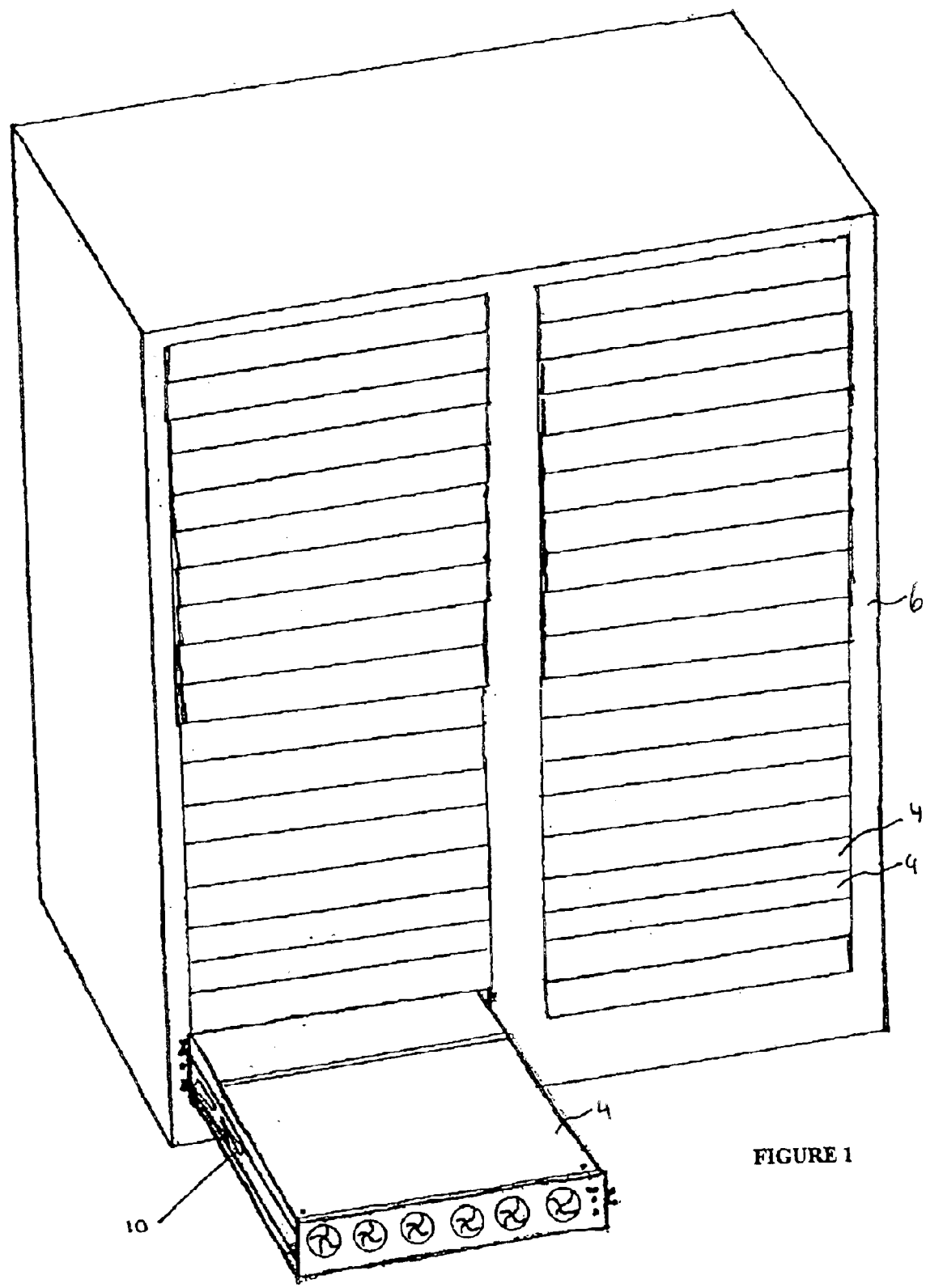
FIG. 1 depicts a digital data processing system in accordance with the present invention.

In FIG. 1, a digital data processing system 2 is shown having a rack 6 or cabinet, and a plurality of equipment modules 4, each mounted on a chassis slide assembly, of which one chassis slide 10 is visible. The modules 4, which comprise the various components of the digital data processing system 2, are connected to one another, and/or to other devices and/or a network via suitable cabling or other links (not shown). While the figure shows a plurality of chassis all of identical size, one or more chassis in the rack 6 can be of other sizes and configurations. The depth and height of each chassis can be selected as desired to accommodate the set of circuits or data handling components that it contains.

In a preferred embodiment, the system 2 may be a web server of the type used to serve web pages, e.g., on the Internet, an intranet, or other network. The such system 2 may alternatively be a network server which interconnects and serves files to and handles applications for a plurality of personal computer workstations or terminals, and their interactions with devices such as a main computer, printers, etc. The apparatus 2 can also comprise any other digital data processing apparatus, such as another type of server or computer.

Figure 6:
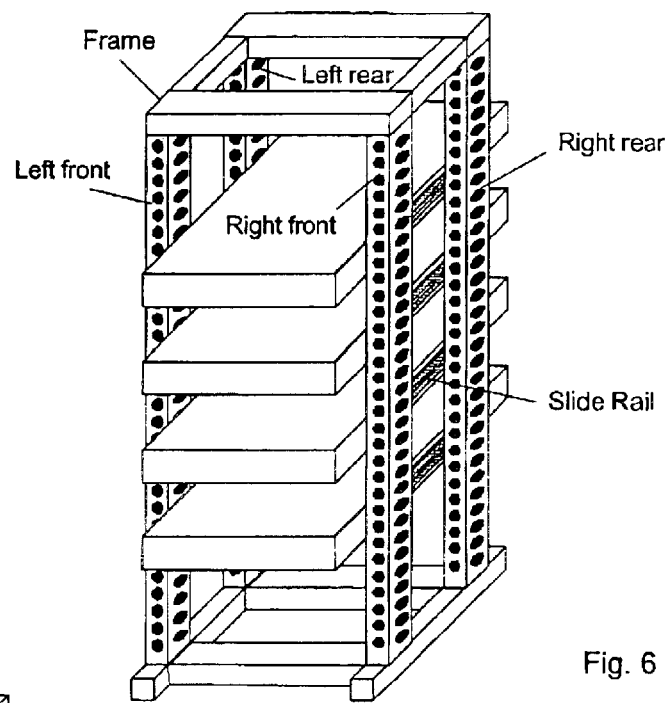
FIG. 6 depicts a plurality of chassis and corresponding slide-rail assemblies according to the invention mounted in a conventional equipment frame.

The rack 6 is a standard industrial or laboratory equipment rack of a type commonly commercially available in the marketplace. Most standard racks are 19" in width and depth. The height may vary, and be selected based on the required storage capacity, i.e., the number and/or the size of the various modules 4 that are to be mounted in the rack. The racks can be of any desired size and configuration, and can be constructed from any type of substantially rigid or otherwise suitable structural material, such as plastic, metal or combinations thereof. Referring to FIG. 6, the rack 6 includes four (or more) vertical mounting rails with apertures or other structures, as necessary, to facilitate mounting equipment, such as the slide-rail assemblies discussed below.

The modules 4 are contained in a fully enclosed or partially open housing or chassis, which again may be of the types commonly used and commercially available. A chassis generally includes side walls and a bottom and top plate. The top of the chassis can be fully removable to allow for access to the components, or can be slideable or hinged for the same purpose. In a preferred embodiment, the invention has particular utility for use with chassis having a compact form factor, commonly referred to by the size designation 1U or 2U, wherein the chassis is, for example, 1.75" in height for a 1 U unit. The use of "thin" servers, such as 1 U servers that take up less vertical rack space, allows a given rack to hold more modules. This may be desirable since the mass storage and multi-processing capabilities of many networks require arrays of many disk drive and/or processor units to effect many tens or hundreds of essentially simultaneous communications, typically from a single file or a small set of files, e.g., web pages.

The chassis slides 10 of the present invention are used to mount the modules 4 within the rack 6, and to facilitate access to each module 4 by allowing it to slide out like a drawer. This provides high availability, convenient accessibility and enhanced serviceability to assure that a module has minimal downtime, allowing for quick maintenance, repair and/or replacement of parts, components or submodules. With the use of a chassis slide 10, those components are easily accessed by sliding the module, drawer-like, out of the rack. In many respect, the slides 10 may employ any of the prior art constructions found in file cabinet, drawer or equipment slides. However, in accordance with a principal aspect of the invention, the slides have transverse openings that effectively allow airflow into or out of the vent openings placed in the chassis sides. This allows a substantial reduction of in-chassis back pressure, so that higher levels of air circulation are more readily attained, and internal airflow pathways may be defined, to assure against air stagnation or component overheating and thus enhance the system reliability.

FIG. 2 shows a preferred chassis slide 10 of two-part construction, having a track 12 and rail 14 that slideably engage one another. The rail 14 and track are adapted for coupling to the chassis and to a rack, respectively. The rail 14 and track 12 can be constructed of any substantially rigid material, e.g. plastic or metal, and can be of any suitable shape or size. Thus, for example, one part may carry wheel-like rollers that are captured by and roll within a C-shaped longitudinal body of the other, or one part may slide within the other, or both parts may interfit such that they move against a plurality of small rollers or slide blocks. However, the rail/track construct allows a major portion of both the rail and the track to have transverse openings in the region of the chassis vents. The length of the rail 14 and track 12 can be selected as desired to accommodate the depth of the chassis. According to Electronics Industry Association standard specifications EIA 310-D, the distance between the rails, when mounted on a 19 inch rack, should be a minimum of 17.72 inches. This would correspond to a maximum thickness of each rail/track side unit of 0.64 inches if they mounted flush with the rack risers.

The rail 14 and track 12 each have at least one aperture 16 for facilitating the flow of air through a chassis. The size of the apertures can vary depending on the size of the chassis, the number of components within the chassis, and the amount of heat generated by the components. In the illustrated embodiment, the apertures 16 may be generally rectangular and spaced evenly over a portion of the rail 14 and the track 12. In particular, the illustrated embodiment has a rail 14 that is configured to be affixed to the cabinet or rack 6, and that has discrete sets of louver apertures, each set defining a vent over an area of about one by four inches, while the track is configured to mount directly on the chassis and has a single large one by four inch opening to align with each set. Preferably, the track openings are positioned exactly adjacent to the chassis vent openings (23, FIG. 4 below), and the larger opening assures there will be no flow obstruction despite being positioned close to the chassis side wall. The apertures may be about approximately ½ to about four inches in length, and about ¼ to one inch in height, though any size suitable to provide the desired airflow without weakening the chassis slide can be used. Thus, as illustrated below, the apertures may include elongated stamped louvers in which the slotted metal is bent outwardly to form an opening while providing out-of-plane stiffening against bending. They may also include arrays of punched holes, e.g., about one-quarter inch in diameter. Thus, the apertures can be of varied shape or size, and can be placed in any suitable location. By way of non-limiting example, the apertures of the rail 14 and track 12 can be substantially aligned with one another, and with openings in the chassis 24 (see FIG. 4), for example, when the chassis slide 10 is in a fully engaged position 20 (shown in FIG. 3) i.e., the rail 14 is fully inserted into the track 12.

The track 12 can have at least one mounting clip 18 adapted to fix the track 12 to the rack or cabinet, or hold the track in the rack. In the illustrated embodiment (see FIG. 2), the mounting clip 18 has a face that extends transverse to the axis of the track with an open or horseshoe shaped clip opening for receiving a screw or bolt. However, those of ordinary skill in the art will appreciate that any type of fastening element or mounting element can be used to mount the track 12 to a rack. By way of non-limiting example, the mounting clip 18 can consist of a snap. The track 12 can also be built into the rack, or otherwise affixed to the rack, thereby eliminating the need for a mounting clip 18 to retain it as the slide assembly is pulled out.

The rail 14 can also be configured so it may be fixed to at least one of the rack and the track 12 to lock it in position and prevent the rail 14 from sliding with respect to the track 12. For this purpose a similar retention clip 22 may be provided. In the illustrated embodiment (see FIG. 2), the retention clip 22 consists of a horseshoe shaped clip for receiving a screw or bolt. The clip can be securely fastened to the rack or the track to prevent movement of the module in the rack. The clip is typically placed on the front end of the rail, so as to secure the rail to the front of the rack. This allows for easy removal of the fastening element so that the module may be slid out of the rack with little difficulty. Those of ordinary skill in the art will appreciate that any type of fastening element or mounting element can be used to mount the track 12 to a rack. By way of non-limiting example, the retention element can consist of a hook and clasp.

FIG. 3 shows the rail 14 and track 12 of the present invention slidably engaged with one another. Those skilled in the art will appreciate that any mechanism known in the art, consistent with the above described aperture arrangements, can be used for enabling the rail 14 and track 12 to slidably engage one another. By way of non-limiting example, wheels can be placed on the rails 14 and roll within a guideway formed by a C-shape track contour for sliding the rail 14 along the track 12.

Figure 4:
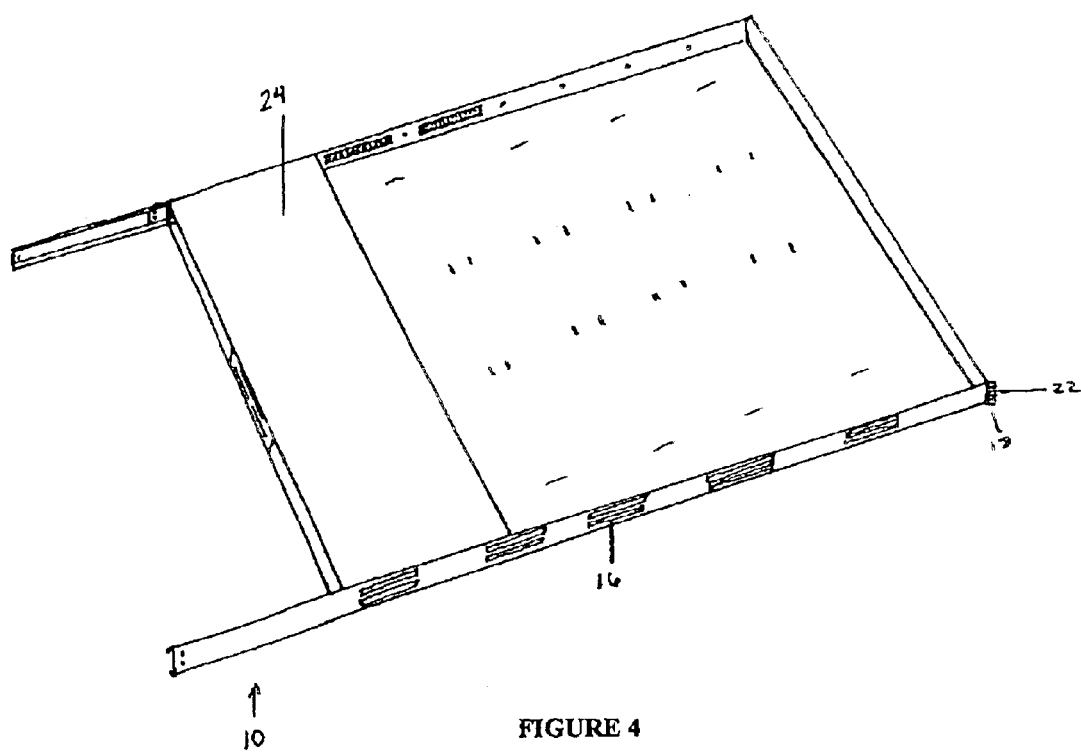
FIG. 4 depicts the assembled slide components mounted on a chassis in accordance with the present invention.

FIG. 4 shows the chassis slide of the present invention coupled to a chassis 24. The rail 14 is removably attached to the chassis 24, such that movement of the rail along the track causes the chassis to move. Those of ordinary skill in the art will appreciate that any type of securing or fastening means can be used to couple the rail 14 with the chassis 24. The rail 14 may also be built into the chassis, thus eliminating the need for any securing or fastening means. The apertures 16 of the rail 14 and track 12 are shown substantially aligned with a set of apertures 23 that are formed in the rear side wall of the chassis.

Figure 5:
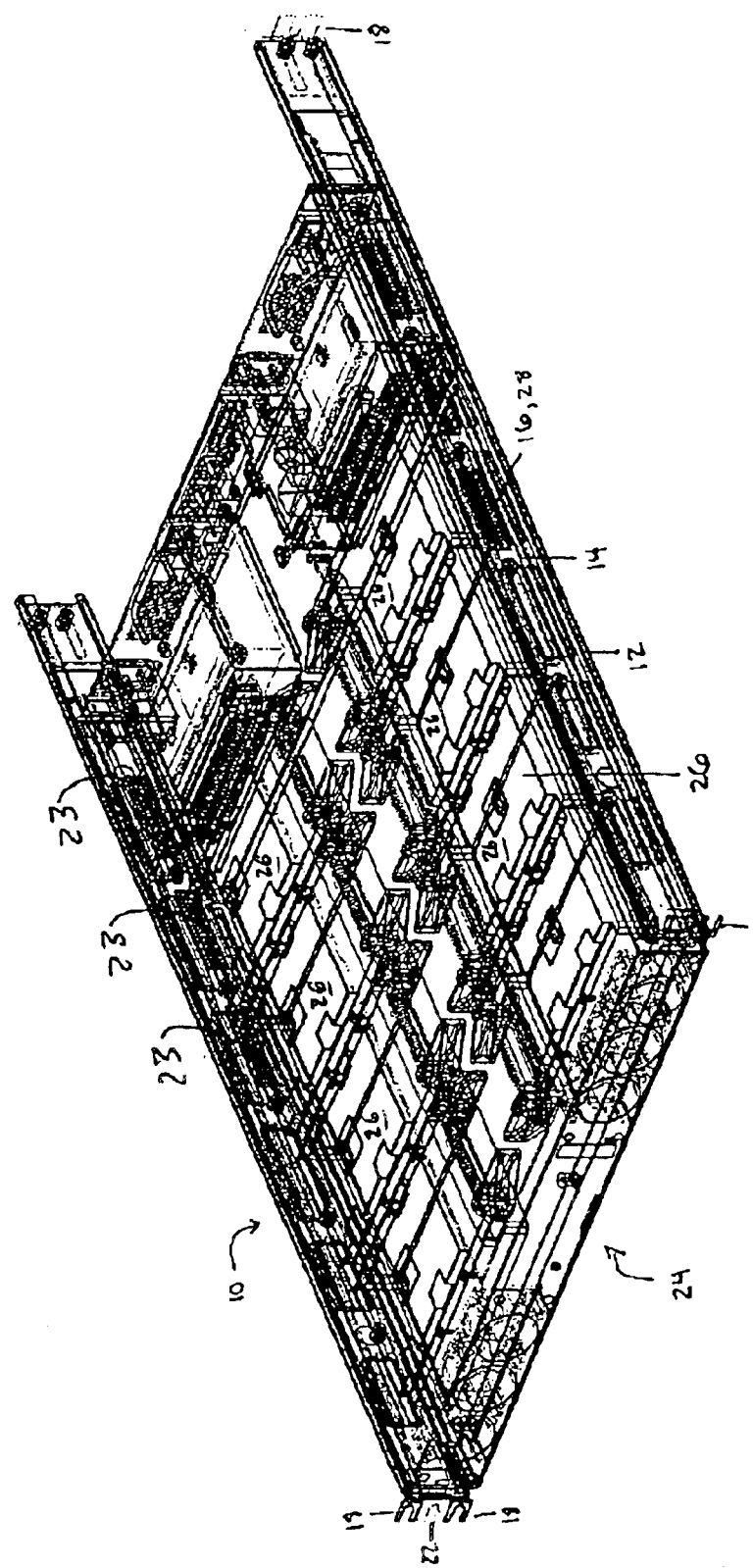
FIG. 5 depicts a chassis having a slide-rail assembly, as well as storage, control or data handling components mounted thereon, in accordance with the present invention.

FIG. 5 illustrates a preferred embodiment of the chassis slide 10 of the present invention fixed to a chassis 24 having components 26. In the illustrated embodiment, the rail 14, track 12, and chassis 24 have a plurality of airflow apertures 16, 23 which are substantially aligned with one another. The chassis apertures may be positioned substantially at the back of the chassis to provide a general flow gradient within the chassis (in which case the front sets of slide apertures simply reside next to solid wall and perform no function), or the chassis apertures may be aligned with a plurality of component or board bays 26, so that the vents defined airflow over the components or boards mounted in the arrays. Both arrangements provide an improvement in overall air flow, allowing the components to be packed in a closely-fitting array within the covered chassis.

FIG. 6 depicts a 19" equipment frame, or other frame of like configuration, having mounted therein a plurality of chassis with slide rail assemblies of the type described above. Such a frame can be open, as shown in FIG. 6, or covered to form a cabinet, e.g., as generally shown in FIG. 1. The illustrated frame includes four mounting rails, labelled left-front, right-front, left-rear and right-rear, as shown, with feet and supporting stiles, also as shown. As evident in the drawing, the rails of left and right slide-rail assemblies of the type described above are mounted, via sheet metal screws, bolts, rivets, welds or otherwise, to respective sides of the chassis. The forward and rearward portions of the rails are similarly mounted to the mounting rails, e.g., typically by screws, bolts or other removable attachment means.

Figure 7:
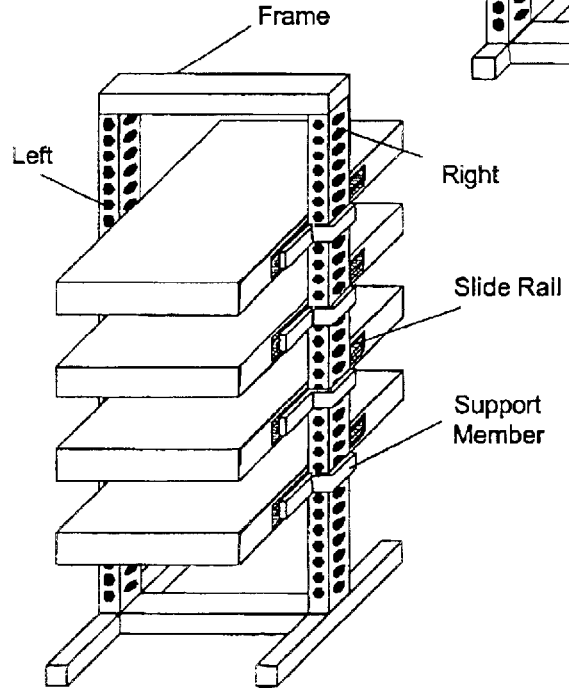
FIG. 7 depicts a plurality of chassis and corresponding slide-rail assemblies according to the invention mounted in a telco-style equipment frame.

In this regard, FIG. 7 depicts a further embodiment of the invention in which a slide-rail of the type described above is mounted in a telco frame or other frame having not four (or more), but two mounting rails. As above, the rails may be incorporated into a covered cabinet and they include feet and supporting stiles, also as shown. Unlike the configuration of FIG. 6, the forward and rearward portions of the rails cannot be mounted to respective ones of four mounting rails—there being only two mounting rails in the rack of FIG. 7.

Figure 8:
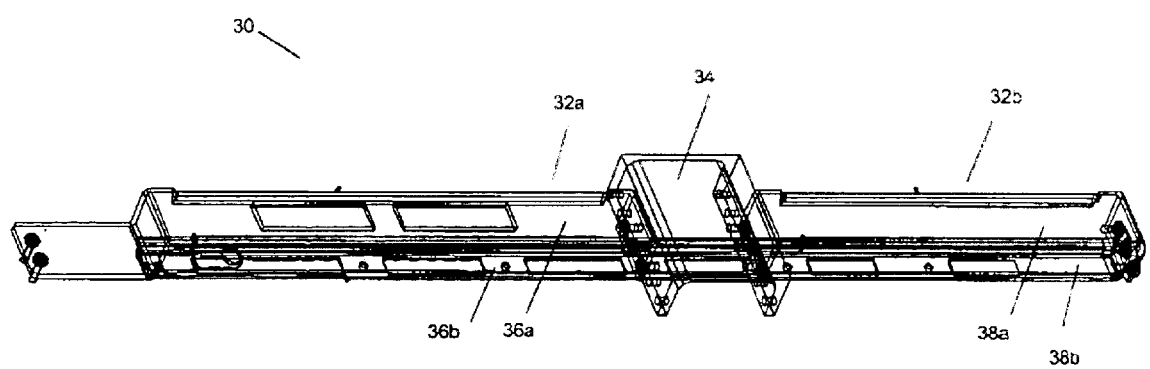
FIG. 8 depicts a support member for use in mounting a slide-rail assembly in the equipment frame of FIG. 7.

To provide adequate support for the rails, there are provided left and right mounting members of the type shown in FIG. 8. Each mounting member 30 includes forward and rearward horizontally-extending support portions 32a, 32b for mounting of respective portions of the slide-rail assembly rails. Each mounting member 30 also includes a bracket member 34 for mounting to a corresponding mounting rail of the telco (or other) frame. In a preferred embodiment,the portions 32a, 32b and bracket 34 are fabricated from metal and are firmly affixed to one another via welds, bolts, or otherwise.

The horizontal support portions can each include a single extending planar member, though, preferably each include a extending box-like structure for rigidity. In the illustrated embodiment, those box-like structures comprise mating channels 36a, 36b (for portion 32a) and 38a, 38b (for portion 32b), with each channel having a U-shaped cross-section as shown. The channels comprising each horizontal support portion can be welded, bolted or otherwise affixed to one another. The can likewise be welded or bolted to the bracket member 34, as discussed above.

In the illustrated embodiment, the channels 36a, 36b and 38a, 38b include apertures as illustrated. As with the apertures discussed above in connection with the slide-rail and chassis, these facilitate the exchange of cooling airflow with the internal components of the chassis. The apertures in the channels 36a, 36b and 38a, 38b are preferably disposed for alignment with those of the slide-rail and chassis when the slide-rail is in the fully closed or engaged position. At least the inner channels 36b and 38b include mounting apertures for affixation to the rails of the slide-rail assembly.

Illustrated bracket member 34 is also configured of a U-shaped member. It is disposed transverse to those of channels 36a, 36b and 38a, 38b, as shown in the illustration, for affixation to the frame's mounting rail. The bracket can be machined from a solid block or constructed from multi-gauge sheet metal to permit rigid affixation of the channels and secure affixation to the mounting rails of the frame. Mounting apertures are provided on the bracket 34 as illustrated to facilitate its affixation to the frame mounting rails.

It will be appreciated that although the cooling of digital data processors has always been a concern with computer designers, the high demand for improved reliability of server systems, along with ever-increasing microprocessor power dissipation and system power consumption, have created additional problems with cooling system design. While fans are typically used to push or pull air from one side of a chassis, across the electrical components, and out the other side, the ability to cool components with air is restricted by the ability to channel or direct airflow. Since air follows the path of least resistance, large volumes of air may be passed through a chassis without ever cooling certain components. The present invention allows a further degree of flexibility in determining a desired path of air flow within a device, so that a front-to-back gradient may be introduced and greater volumes of air may be passed through the chassis, with the decreased back-pressure resulting in lower fan energy requirements. Various modifications of this construction may be employed to further produce more compact, low profile devices for web or network servers, with various commonly-owned method and apparatus inventions developed by applicant to enhance heat dissipation or cooling mechanisms in densely arrayed web server equipment. These provide a range of architectures and constructions to which the structures, elements and arrangements of the present invention are advantageously applied. For example, co-pending, commonly assigned, U.S. patent application Ser. No. 60/216,055 filed Jul. 5, 2000, entitled "Low Profile Equipment Housing with Angular Fan" provides an angled fan disposed within a chassis for integrating the region around a component into the airflow pattern. Other apparatus and methods include a ventilated slide rail which facilitates the flow of air throughout the chassis which (see co-pending, commonly assigned, U.S. patent application Ser. No. 60/215,975 filed Jul. 5, 2000, entitled "Low Profile High Density Storage Array" and co-pending, commonly assigned, U.S. patent application Ser. No. 60/244,361, entitled "Low Profile High Density Storage Array," filed Oct. 30, 2000). Another commonly owned invention is a power interconnect for data handling and storage devices providing additional airflow space or compact fixed interconnecting structure (see commonly assigned, co-pending U.S. patent application Ser. No. 60/215,996 filed Jul. 5, 2000, entitled "Power Supply for Low Profile Equipment Housing"). Another is a circuit board riser which among other attributes, occupies less space, thereby providing additional space for airflow to travel (see commonly assigned, co-pending U.S. patent application Ser. No. 60/215,995 filed Jul. 5, 2000, titled "Circuit Board Riser"). Another commonly owned U.S. patent application, Ser. No. 60/215,952, filed Jul. 5, 2000, entitled "Server Architecture and Methods for Digital Data Processing," describes a unique architecture for server systems and the monitoring of physical or utilization status. Each of the foregoing constructions is advantageously employed in a system of the present invention and the air flows achieved with the vented slide assemblies of this invention may be advantageously combined with the enhanced flows or air spaces, and the increased circuit or device density, of the constructions described in one or more of the foregoing co-pending, commonly assigned, U.S. patent applications, which in combination with the structures and devices described herein extends each of the above inventions. All of the foregoing patent applications are hereby incorporated herein by reference.

The chassis slides 10 discussed herein provide for the further cooling of such densely packed, and more compact systems. By providing slots or airflow apertures in the chassis sides and the chassis slides 10, additional areas of chassis wall may participate in venting, and back pressure at the inlet or exhaust fans is lowered. For example, when an inlet fan introduces positive pressure, air pressure is reduced at the region of the slots within the chassis, and air flows within the chassis toward the slots. Thus, the apertures facilitate the flow of air throughout the chassis and across the components, and allow the sides of the chassis to be utilized both for overall enhancement of cooling, and to provide specific cooling air paths for the given component layout. The slots allow a greater volume of cooling air to be moved through the confined space of a closed, component-filled chassis for a given front-face fan configuration, and the placement of the slots may be adapted to the particular size and locations of components to assure an adequate air stream at a particular region, such as the location of a processor chip, motherboard or power supply.

One skilled in the art will appreciate further features and advantages of the invention based on the above-described embodiments. Accordingly, the invention is not to be limited by what has been particularly shown and described, but will be understood to encompass such variations and modifications and related structures lying within its spirit and scope, as will naturally occur to those skilled in the art. All such variations and modifications are considered to be part of the invention described herein, as defined by the claims appended hereto and their equivalents.

All publications and references cited herein are expressly incorporated herein by reference in their entirety.

What is claimed is:

1. A chassis slide comprising
    a rail and a track that are slidably engaged with one another and that are adapted for coupling to a chassis and a rack for telescopic movement to slide the chassis into and out of the rack, the rail and track each having at least one air flow aperture for facilitating a passage of air through the chassis slide,
    the track being adapted for mounting to the rack, and
    the rail being adapted to be fixed to at least one of the rack and the track to prevent slidable movement of the rail with respect to the track,
    the track including at least one mounting clip adapted to fix the track to the rack, and
    the rail including a retention clip adapted for fixing the rail to the rack.

2. A chassis slide comprising
    a rail and a track that are slidably engaged with one another and that are adapted for coupling to a chassis and rack, the rail and track each having a plurality of air flow apertures for facilitating a passage of air through the chassis slide,
    the track being adapted for mounting to the rack, and
    the rail being adapted to be fixed to at least one of the rack and the track to prevent slidable movement of the rail with respect to the track,
    the track including at least one mounting clip adapted to fix the track to the rack, and
    the rail including a retention clip adapted for fixing the rail to the rack.

* * * * *